Oct. 15, 1974 D. M. MacARTHUR ET AL 3,841,931
MILD ACID ETCH FOR TUNGSTEN
Filed July 23, 1973
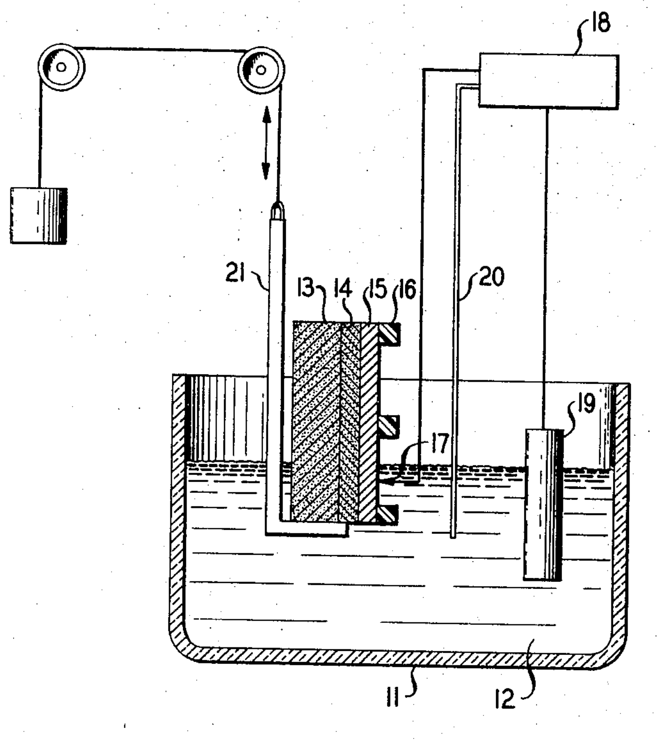

United States Patent Office 3,841,931
Patented Oct. 15, 1974

3,841,931
MILD ACID ETCH FOR TUNGSTEN

Donald Morley MacArthur, Berkeley Heights, and Peter Kenny Skurkiss, Bloomfield, N.J., assignors to Bell Telephone Laboratories, Incorporated, Murray Hill and Berkeley Heights, N.J.

Filed July 23, 1973, Ser. No. 381,984
Int. Cl. C23b *3/02*; C23f *1/00*
U.S. Cl. 156—18 7 Claims

ABSTRACT OF THE DISCLOSURE

A method of etching tungsten involves contacting a tungsten surface with an aqueous solution of an organic acid buffer at a pH below 7.0 while exposing the surface to an agency providing an oxidation potential between 0.1 and 0.6 volts.

This invention relates to a technique for etching a tungsten film. More particularly, the present invention relates to a technique for etching a tungsten film with an aqueous solution of an organic acid buffer.

In the fabrication of semiconductor integrated circuits, interconnections are commonly prepared by a processing sequence involving the deposition of an insulating layer upon a substrate surface, the formation of through-holes thereon, deposition of a conductive film on the insulating layer and selective etching of the conductive film. The selective etching typically involves the use of a mask which corresponds with the desired pattern and an etching solution capable of attacking the film.

The acuity of the definition of the pattern in the conductive film is, of course, limited by the ability of the masking layer to withstand the etching solution. Unfortunately, the use of relatively inert materials such as tungsten, requires strong etchants which often attack or undercut the masking layer, so causing a loss in pattern resolution.

Recently, it was observed that tungsten films disposed on insulating substrates cannot be removed by conventional electrolytic etching techniques due to the fact that such techniques result in the formation of a plurality of isolated islands upon the insulating substrate. This difficulty was successfully obviated by the use of electrolytes which also manifest chemical etching properties. The most commonly used etchants for this purpose are the alkaline ferricyanides. This etchant manifests an electrolytic etching rate substantially greater than its chemical etching rate and at the termination of electrolytic etching the chemical etching action removes the electrically isolated islands alluded to above. Although such systems provided acceptable pattern definition they suffered from the conventional limitations of chemical etching systems in that a skilled operator was required to terminate the etching sequence. Batch processing introduced variations which required sampling each batch to determine optimum etching time.

More recently, the foregoing limitations were overcome by a technique which permitted the automation of patterning of tungsten films. This technique involved etching tungsten by electrolytic means at a constant potential in a borate, phosphate or carbonate buffered electrolyte having a pH within the range of 7.0 to 10.5. Studies have revealed that at lower pH values the tungsten surfaces are considered passive to the oxidizing mechanism involved in the etching process, so prompting workers in the art to seek suitable alternate approaches.

In accordance with the present invention, it has been found that when tungsten is etched in certain organic acid buffers, specifically, those soluble in water which are stable at an oxidizing potential of from 0.1–0.6, the tungsten oxides are formed and dissolved at practical rates down to pH's of 3.5.

The invention will be more readily understood by reference to the following detailed description taken in conjunction with the accompanying drawing wherein;

The figure is a schematic diagram of an apparatus suitable for use in the practice of the present invention.

With reference now more particularly to the Figure, there is shown a container 11 having contained therein an electrolyte 12 selected from among the citrates, tartrates, propionates and acetates, of sodium, potassium and ammonia. The pH of the electrolyte is maintained within the range of 3.5 to 7.0, such range being dictated by considerations relating to the rate of etching at the lower end and practical limitations at the upper end. Shown disposed within container 11 is a typical substrate member 13 comprising a semiconductor material such as silicon, and the like. Disposed upon the substrate 13 is an insulating film 14 which may be selected from among any of the well known insulators compatible with semiconductors. In the illustrative example, 14 represents a layer of silicon dioxide. A tungsten film 15 which it is desired to etch, is shown deposited on insulating layer 14 and a photoresist 16 is shown selectively deposited upon tungsten 15. When the apparatus is utilized for electrolytic etching, electrical contact to film 15 is provided by means of a conventional contact 17, one end of which is connected to potentiostat 18. Electrical contact with the electrolyte is provided by means of electrode 19, one end of which is connected to the other side of potentiostat 18 and reference electrode 20. A motor driven mechanism 21 is provided for the purpose of lowering the substrate into the electrolyte. Alternatively, the oxidation potential required for etching of tungsten may be provided by means of a chemical agent having an oxidation potential within the range of 0.1–0.6 volts, iodine and cupric chloride being suitable for such purposes. However, it has been found that the cupric chloride is effective only in conjunction with the citrate buffers due to precipitation of copper hydroxide.

In the operation of the inventive electrolytic etching process, a difference of potential within the range of 0.1 to 0.6 volts with respect to a refereence electrode (saturated calomel) is applied between tungsten film 15 and electrolyte 19 by means of potentiostat 18. Ordinarily, the current generated thereby cannot satisfactorily etch a single metal layer on an insulating substrate due to the formation of isolated unetched islands. However, tungsten is unique in that the dioxide intermediate is a conductor and maintains continuity in the pattern.

In practice, it is found advantageous to maintain the desired operating conditions by lowering the material slowly into the solution as etching proceeds so that a maximum length of about 2 cm. of unetched tungsten is in the solution at all times.

Referring again to the illustration described above, etching is initiated by applying a potential difference between tungsten film 15 and electrolyte 12 by means of potentiostat 18. The d-c source is adjusted so that the tungsten film 15 is relatively biased with respect to the reference 20 in electrolyte 12. A potentiostat 20 is employed to adjust the current density at the surface of tungsten to a value within the range of 3 to 10 milliamps/sq. cm.

The electrolytic etching continues to a point where the exposed tungsten is removed, this point being evidenced by an abrupt decrease in electrolytic current. At that point the potentiostat is turned off and etching terminated.

Chemical etching may be effected by selecting an oxidizing agent compatible with the electrolyte which operates in the desired potential range. Oxidizing agents operating within the 0.1–0.6 volt range are cupric chloride, ferric chloride and iodine. Efforts to use ferric chloride for this purpose are unsuccessful due to precipitation of ferric hydroxide at pH values slightly above 0. Similarly, attempts to use cupric chloride in the tartrate, propionate and acetate systems fail due to precipitation of copper hydroxide at a pH of about 1.5. The cupric chloride-citrate system however proves effective. Iodine may be used in conjunction with any of the described systems.

Examples of the present invention are set forth below. It will be understood by those skilled in the art that the examples and the above described illustrative example are merely for the purpose of exposition and are not restrictive in nature.

Example 1—Electrolytic Etching

The substrate selected for use herein was a silicon wafer having a layer of silicon dioxide deposited thereon. The silicon slice was 1¼" in diameter and had a 10,000 A. thick coating of tungsten deposited thereon. The electrolytic cell was comprised of a platinum counter electrode and a saturated calomel reference. The slice to be etched was held by a titanium clip adapted with a rack and pinion slide which permitted the plate to be slowly lowered into the solution. The electrolyte was one molar in ammonium citrate and 0.38 molar in citric acid having a pH of 4.0. The electrical circuit employed included a potentiostat, digital voltmeter and chart recorder which was used to monitor potential and current, respectively. Approximately 25% of the slice was immersed in the solution and the potentiostat turned on and current observed. The current was initially 18 milliamps and decreased to 6 milliamps. The slice was lowered into the solution until fully immersed. When the current dropped to 200 microamps the potentiostat was turned off. A photomicrograph of the etched sample revealed that the edges were only slightly sloped and that etching was effected in a uniform manner.

Example 2.—Chemical Etching

A chemical etchant having a pH of 0.9 was prepared by dissolving 64 grams $CuCl_2 \cdot 2H_2O$, 10.5 grams of citric acid and 56.3 grams of ammonium citrate in about 200 milliliters of water. Concentrated KOH solution (30% by weight) was slowly added until the pH was raised to 4.9 and the total solution volume was adjusted to 300 milliliters with additional water. The molar concentration of each species was: $CuCl_2$—1.25, citrate—1.0 and ammonia 1.6. A $Si/SiO_2$ substrate with 1700 A. of tungsten was etched in this solution in the apparatus shown in the figure (without the application of a difference of potential) at room temperature using a photoresist. Etching was complete in 8 minutes. Microscopic examination revealed a sharply etched pattern free of residue. The same solution was heated to 57° C. and 1700 A. of tungsten was etched in 90 seconds with the same degree of resolution.

Example 3.—Chemical Etching

A chemical etchant having a pH of 4.4 was prepared by dissolving 41.5 grams of potassium iodide in 60 milliliters of $H_2O$ and 15.8 grams of iodine was added together with 125 milliliters of 2 molar ammonium citrate solution. 8 milliliters of 30% potassium hydroxide was added to adjust the pH to 5.0 and the solution was diluted to 250 milliliters with water. Etching was conducted in the manner described in Example 2. Etching was complete in 9 minutes at room temperature and 2 minutes at 65° C. Microscopic examination revealed a sharply etched pattern free of residues.

What is claimed is:

1. A method of etching tungsten comprising contacting a tungsten surface with an aqueous solution of an organic acid buffer at a pH below 7.0 while exposing said surface to an agency providing an oxidation potential between 0.1 and 0.6 volts when measured with respect to the saturated calomel electrode.

2. Method in accordance with claim 1 wherein said organic acid buffer is selected from that group consisting of the citrates, tartrates, acetates and propionates of sodium, potassium and ammonia.

3. Method in accordance with claim 2 wherein said agency is an external voltage source, the tungsten being maintained anodic.

4. Method in accordance with claim 2 wherein said agency is a chemical agent having an oxidation potential within the range of 0.1–0.6 volts.

5. Method in accordance with claim 3 wherein said buffer comprises ammonium citrate and acetic acid.

6. Method in accordance with claim 4 wherein said chemical agent is cupric chloride.

7. Method in accordance with claim 4 wherein said chemical agent is iodine.

References Cited

UNITED STATES PATENTS

| | | | |
|---|---|---|---|
| 3,411,999 | 11/1968 | Weinberg | 156—18 X |
| 3,529,350 | 9/1970 | Rairden | 156—11 X |
| 3,772,104 | 11/1973 | Chandross | 156—18 |
| 3,785,945 | 1/1974 | MacArthur | 204—129.95 |

WILLIAM A. POWELL, Primary Examiner

U.S. Cl. X.R.

156—8, 17; 204—129.75; 252—79.4